United States Patent [19]
McClure

[11] Patent Number: 5,349,243
[45] Date of Patent: Sep. 20, 1994

[54] LATCH CONTROLLED OUTPUT DRIVER

[75] Inventor: David C. McClure, Carrollton, Tex.

[73] Assignee: SGS-THOMSON Microelectronics, Inc., Carrollton, Tex.

[21] Appl. No.: 85,760

[22] Filed: Jun. 30, 1993

[51] Int. Cl.⁵ ........................ H03K 3/284; H03K 3/01
[52] U.S. Cl. .................... 307/272.1; 307/272.3; 307/279; 307/241; 307/270
[58] Field of Search ............... 307/272.1, 272.3, 279, 307/241, 270

[56] References Cited
U.S. PATENT DOCUMENTS 5,294,847  3/1994  Grossman et al. ............... 307/279

Primary Examiner—Margaret R. Wambach
Attorney, Agent, or Firm—Kenneth C. Hill; Lisa K. Jorgenson; Richard K. Robinson

[57] ABSTRACT

An output driver includes a pull-up and a pull-down transistor in series between an upper and a lower power supply voltage. Each transistor is controlled by a latch connected to its gate. Control transistors are cross-coupled between inputs to the latches and a power supply voltage to force at least one of the latches to be in a known state. This prevents both of the transistors from turning on simultaneously.

21 Claims, 1 Drawing Sheet

LATCH CONTROLLED OUTPUT DRIVER

CROSS-REFERENCE TO RELATED APPLICATIONS

The present application is related to U.S. patent application Ser. No. 08/085,980, entitled "Method and Apparatus For Parallel Testing of Memory", and U.S. patent application Ser. No. 08/085,588, entitled "Cache Tag Memory" filed of even date herewith by the inventor hereof, assigned to the assignee herein, and incorporated herein by reference.

BACKGROUND OF THE INVENTION

1. Field of the Invention

The present invention relates to the field of microelectronics and in particular to digital circuits. Still more particularly, the present invention relates to output drivers in digital circuits.

2. Description of the Prior Art

In a digital circuit system, a common path is often used to share and transfer data between various circuits and devices in the system. A small set of shared lines, a bus, may be used to provide the common path. In the designing of digital circuit systems, some devices may have an insufficient amount of maximum output current to drive all of the lines connected to the devices. As a result, a current amplifier, called a driver or a buffer, is used to provide the needed currents.

Latches are often used to control output drivers in digital circuit systems. The state of these latches is often critical during the power up phase of a digital circuit system. For example, in an output driver circuit having a pull up and pull down transistor and having two latches controlling the pull up and pull down transistors, forming the output driver, the individual latches may power up in states that turn on both transistors at the same time. Such a condition is known as a "crowbar" condition. Frequently, parts that have differential data bussed all the way to the output can see such effects.

In some cases, a power-up reset circuit is used to force the state of the latches to some preset state to avoid a crowbar condition. Such a solution is not always sufficient. For example, sometimes the state of the differential buses may not be differentiated, leading to a crowbar condition during non-power-up conditions. Also, a glitch in device operation or external conditions such as a power supply may cause non-differentiation during a non-power-up condition.

In other cases, during testing of the device, a defective memory cell may be accessed, rendering the differential buses non-differentiated and creating a crowbar condition at the outputs. In such a situation, the bad memory cell may be replaced by redundant memory cells, but the testing of the bad memory cell may have fused the power supplies or in some other way rendered the device unusable.

Therefore, it would be desirable to have an apparatus to prevent a crowbar condition from occurring in a output driver controlled by two or more latches.

SUMMARY OF THE INVENTION

An output driver according to the present invention includes a pull-up and a pull-down transistor in series between an upper and a lower power supply voltage. Each transistor is controlled by a latch connected to its gate. Control transistors are cross-coupled between inputs to the latches and a power supply voltage to force at least one of the latches to be in a known state. The control transistors prevent both of the pull-up and pull-down transistors from turning on simultaneously. The latch controlled output driver circuit additionally contains a first pass gate having an output connected to the input of the first latch circuit; a second pass gate having an output connected to the input of the second latch circuit; a first control transistor having a source connected to the upper power supply voltage, a drain connected to the input of the first latch circuit, and a gate connected to the input of the second latch circuit; and a second control transistor having a source connected to the upper power supply voltage, a drain connected to the input of the second latch circuit, and a gate connected to the input of the first latch circuit.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
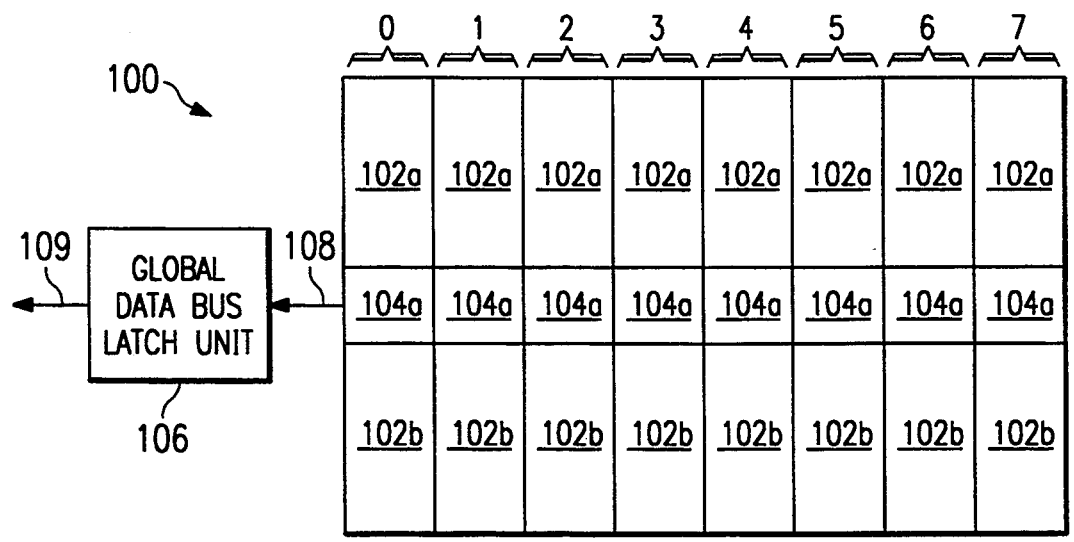
FIG. 1 is a block diagram of a memory unit in which a preferred embodiment of the present invention may be implemented.

Referring now to FIG. 1, a block diagram of a memory array 100 is illustrated in which a preferred embodiment of the present invention may be implemented. Memory array 100 (also just called a "memory") is subdivided into eight memory groups: 0–7. Each memory group contains a memory block 102a, a memory block 102b, and an input/output (I/O) block 104a. I/O block 104a is interposed between the two memory blocks 102a and 102b. Data bus latch block 106 is connected to the I/O blocks 104a of memory groups 0–7 via a data array 108. Data bus circuit block 106 also has an output array 109. Data bus latch block 106 includes latch controlled output drivers.

Figure 2:
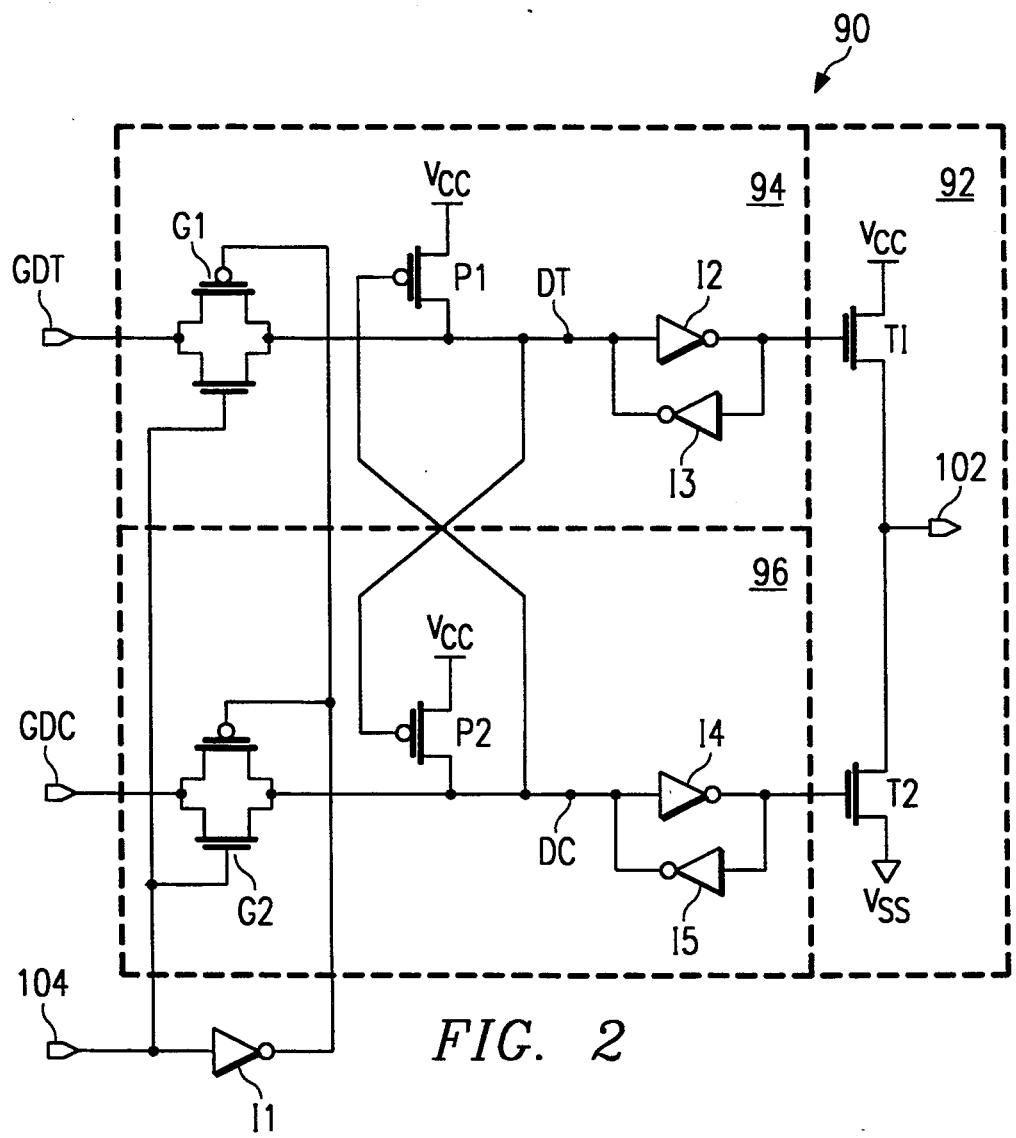
FIG. 2 is a schematic diagram of a latch controlled output driver.

Referring to FIG. 2, a schematic diagram of a latch controlled output driver 90 is depicted. Latch controlled output driver circuit 90 includes an output driver 92 and latches 94 and 96. Latch controlled output driver circuit 90 is constructed from pass gates G1 and G2, transistors P1, P2, T1, and T2; and inverters I1–I5. Transistors P1 and P2 are p-channel metal-oxide field effect transistors (MOSFETs) while transistors T1 and T2 are n-channel MOSFETs. The circuit is powered by connecting the sources of transistor P1 and P2 to power supply voltage VCC and the drain of transistor T1 to power supply voltage VCC and by connecting the source of transistor T2 to power supply voltage VSS. Typically, power supply voltage VCC is at a higher voltage than power supply voltage VSS.

Output driver 92 includes transistors T1 and T2 and has an output node at point 102. Transistor T1 is a pull-up transistor and transistor T2 is a pull-down transistor in the output driver portion of this circuit. The gate of transistor T1 is controlled by a signal from input point GDT passing through pass gate G1 and inverters I2 and I3 of latch 94. Similarly, the gate of transistor T2 is controlled by a signal from input point GDC passing through pass gate G2 and through inverters I4 and I5 of latch 96. Pass gates G1 and G2 are controlled by a clock signal, CLK, applied to point 104 and a complement clock signal, /CLK. The /CLK signal is generated by passing the CLK signal through inverter I1.

Typically, input points GDT and GDC are connected to buses that are precharged high between clock cycles generated by the CLK signal. Afterward, one of the input points, GDT or GDC, selectively goes low when data is read.

The latch portion of the circuit latches 94 and 96, include pass gates G1 and G2 and the cross-coupled inverters I2-I5. Latch 94 contains inverters I2 and I3 and pass gate G1; latch 96 includes inverters I4 and I5 and pass gate G2. Pass gates G1 and G2 pass data to latches 94 and 96, respectively. Although the depicted embodiment shows only two latches connected to the output driver, additional latches may be connected to the output driver and selected using a multiplexing circuit in accordance with a preferred embodiment of the present invention. Other variations to the latches and inverters may be made by those of ordinary skill in the art. For example, inverter I3 in latch 94 and inverter I5 in latch 96 may be replaced with NAND gates instead with the other input being from point DC for the NAND gate replacing inverter I3 and from point DT for the NAND gate inverter I5.

The depicted embodiment shows the use of pass gates for gating or sending information to the latches. Other types of gates or devices known to those skilled in the art for gating or providing an interface circuit for controlling data reaching the latches may be used according to the present invention.

Transistors P1 and P2 are employed to ensure that a crowbar condition does not occur in the output driver portion of the circuit in FIG. 2. These devices prevent points DT and DC from both going low at the same time, during power up while the pass gates are not conductive or during anomalous operations. Transistors P1 and P2 should be sized to overcome the feedback from inverters I3 and I5.

In addition, transistors P1 and P2 may be sized to still exceed the trip point of the inverters driving the output driver transistors T1 and T2 if points DT and DC are being pulled low through pass gates G1 and G2 at the same time by sizing transistors P1 and P2 relative to the pass gate transistors.

Consequently, the use of power-up reset control circuits may be avoided, as well as anomalous operation of the outputs or severe stressing of the device when locating bad memory cells in a memory that may occur during testing of the memory cells. The present invention may be implemented in all integrated circuits requiring output drivers controlled by latches. Such integrated circuits include, for example, memory such as DRAMs, SRAMs, and PROMs. By eliminating the need for a power up control circuit to set the latches, the present invention may reduce the amount of space needed to produce memories and other circuits requiring latch controlled output drivers. Although the present invention is depicted using MOS technology, other types of technology and transistors may used in accordance with a preferred embodiment of the present invention.

While the invention has been particularly shown and described with reference to a preferred embodiment, it will be understood by those skilled in the art that various changes in form and detail may be made therein without departing from the spirit and scope of the invention.

What is claimed is:

1. A latch controlled output driver circuit comprising:
    an output driver circuit including a pull-up transistor and a pull-down transistor, wherein the pull-up transistor has a drain connected to an upper power supply voltage and a source connected to a drain of the pull-down transistor and the pull-down transistor has a source connected to a lower power supply voltage;
    a first latch circuit having an input and an output, wherein the output of the first latch circuit is connected to a gate of the pull-up transistor;
    a second latch circuit having an input and an output, wherein the output of the second latch circuit is connected to a gate of the pull-down transistor;
    a first gate having an output connected to the input of the first latch circuit;
    a second gate having an output connected to the input of the second latch circuit;
    a first control transistor having a source connected to the upper power supply voltage, a drain connected to the input of the first latch circuit, and a gate connected to the input of the second latch circuit; and
    a second control transistor having a source connected to the upper power supply voltage, a drain connected to the input of the second latch circuit, and a gate connected to the input of the first latch circuit.

2. The latch controlled output driver circuit of claim 1, wherein the first gate has an input connected to a true data line and the second gate has an input connected to a complement data line.

3. The latch controlled output driver circuit of claim 2, wherein the first and second control transistors are p-channel MOSFETs.

4. The latch controlled output driver circuit of claim 3, wherein the pull-up transistor and the pull-down transistor are n-channel MOSFETs.

5. The latch controlled output driver circuit of claim 1, wherein the gates are controlled by a clock signal.

6. The latch controlled output driver circuit of claim 1, wherein the first latch circuit includes a first inverter and a second inverter, the input of the first latch circuit being connected to an input of the first inverter and an output of the second inverter and the output of the first latch circuit being connected to the output of the first inverter and the input of the second inverter and wherein the second latch circuit includes a third inverter and a fourth inverter, the input of the second latch circuit being connected to the input of the third inverter and the output of the fourth inverter and the output of the second latch circuit being connected to the output of the third inverter and the input of the fourth inverter.

7. The latch controlled output driver circuit of claim 1, wherein the first latch circuit comprises a first inverter, second inverter, a third inverter, and a fourth inverter connected in series, wherein the input of the first latch circuit is connected to an input of the first inverter and an output of the fourth inverter and the output of the first latch circuit being connected to an output of the second inverter and an input of the third inverter.

8. The latch controlled output driver circuit of claim 1, wherein the first and second gates are pass gates.

9. A memory comprising:
 a plurality of memory groups having a plurality of outputs; and
 a data bus circuit having a plurality of inputs connected the plurality of outputs, the data bus circuit having a latch controlled output driver circuit that includes:
  an output driver circuit including a pull-up transistor and a pull-down transistor, wherein the pull-up transistor has a drain connected to an upper power supply voltage and a source connected to a drain of the pull-down transistor and the pull-down transistor has a source connected to a lower power supply voltage;
  a first latch circuit having an input and an output, wherein the output of the first latch circuit is connected to a gate of the pull-up transistor;
  a second latch circuit having an input and an output, wherein the output of the second latch circuit is connected to a gate of the pull-down transistor;
  a first gate having an output connected to the input of the first latch circuit;
  a second gate having an output connected to the input of the second latch circuit;
  a first control transistor having a source connected to the upper power supply voltage, a drain connected to the input of the first latch circuit, and a gate connected to the input of the second latch circuit; and
  a second control transistor having a source connected to the upper power supply voltage, a drain connected to the input of the second latch circuit, and a gate connected to the input of the first latch circuit.

10. The memory of claim 9, wherein the first gate has an input connected to a true data line and the second gate has an input connected to a complement data line.

11. The memory of claim 10, wherein the first and second control transistors are p-channel MOSFETs.

12. The memory of claim 11, wherein the pull-up transistor and the pull-down transistor are n-channel MOSFETs.

13. The memory of claim 12, wherein the gates are controlled by a clock signal.

14. The memory of claim 12, wherein the first latch circuit includes a first inverter and a second inverter, the input of the first latch circuit being connected to an input of the first inverter and an output of the second inverter and the output of the first latch circuit being connected to the output of the first inverter and the input of the second inverter and wherein the second latch circuit includes a third inverter and a fourth inverter, the input of the second latch circuit being connected to the input of the third inverter and the output of the fourth inverter and the output of the second latch circuit being connected to the output of the third inverter and the input of the fourth inverter.

15. The memory of claim 12, wherein the first latch circuit comprises a first inverter, second inverter, a third inverter, and a fourth inverter connected in series, wherein the input of the first latch circuit is connected to an input of the first inverter and an output of the fourth inverter and the output of the first latch circuit being connected to an output of the second inverter and an input of the third inverter.

16. The memory of claim 9, wherein the first and second gates are pass gates.

17. A control circuit for controlling first and second output transistors in a driver circuit comprising:
 first and second latches, each latch having an output and an input, the first latch having an output connected to a gate of the first output transistor, and the second latch having an output connected to a gate of the second output transistor;
 first and second gates, each gate having an output and an input, the output of the first gate being connected to the input of the first latch and the output of the second gate being connected to the input of the second latch; and
 a regulation circuit connected to the latch inputs for preventing both inputs from simultaneously having a selected state, wherein the selected state at a latch inputs causes a corresponding output transistor to be turned on.

18. The control circuit of claim 17, wherein the regulation circuit comprises:
 a first regulation transistor having a source connected to an upper power supply voltage, a drain connected to the input of the first latch circuit, and a gate connected to the input of the second latch circuit; and
 a second regulation transistor having a source connected to the upper power supply voltage, a drain connected to the input of the second latch circuit, and a gate connected to the input of the first latch circuit.

19. The control circuit of claim 18, wherein the first and second regulation transistors are p-channel transistors.

20. The control circuit of claim 19, wherein the sources of the first and second regulation transistors are connected to a positive upper power supply voltage.

21. The control circuit of claim 17, wherein the first and second gates are pass gates.

* * * * *